United States Patent [19]

Domschat

[11] Patent Number: 4,928,198

[45] Date of Patent: May 22, 1990

[54] HIGH VOLTAGE ELECTRODE DEVICE

[75] Inventor: Klaus Domschat, Lorrach, Fed. Rep. of Germany

[73] Assignee: Eltex-Elektrostatik-Gesellschaft mbH, Weil am Rhein, Fed. Rep. of Germany

[21] Appl. No.: 225,812

[22] Filed: Jul. 29, 1988

[30] Foreign Application Priority Data

Jul. 29, 1987 [DE] Fed. Rep. of Germany ....... 3725142

[51] Int. Cl.$^5$ ........................ G01R 27/02; H02H 3/40

[52] U.S. Cl. .......................................... 361/1; 361/79; 324/694; 101/228; 400/708.1; 226/10

[58] Field of Search ........................ 361/78, 79, 214, 1; 400/708, 708.1; 101/228; 226/10; 324/65 R

[56] References Cited

U.S. PATENT DOCUMENTS 2,978,636 4/1957 Fountain .......................... 324/65 R 4,300,094 11/1981 Piso .................................. 324/65 R

*Primary Examiner*—Todd E. DeBoer

*Attorney, Agent, or Firm*—Antonelli, Terry & Wands

[57] ABSTRACT

A high voltage electrode device including a plurality of individual electrodes having end portions projecting beyond an insulating surface and arranged to form at least one group or electrically connected electrodes and apparatus for energizing and deenergizing each group of electrodes. The energizing and deenergizing apparatus includes a high voltage source associated with a respective group and having a control input for turning off the high voltage source wherein the high voltage source provides an output to the group via a current measuring device providing an output indicative of the current measured. A voltage measuring device is connected to the associated group and provides an output indicative of the voltage measured, and quotient forming unit responsive to the outputs of the current measuring device and the voltage measuring device forming a quotient thereof and providing an output when the quotient formed has a predetermined relation to a reference value. The control input is responsive to the output of the quotient forming unit for turning off the high voltage source of the associated group.

9 Claims, 1 Drawing Sheet

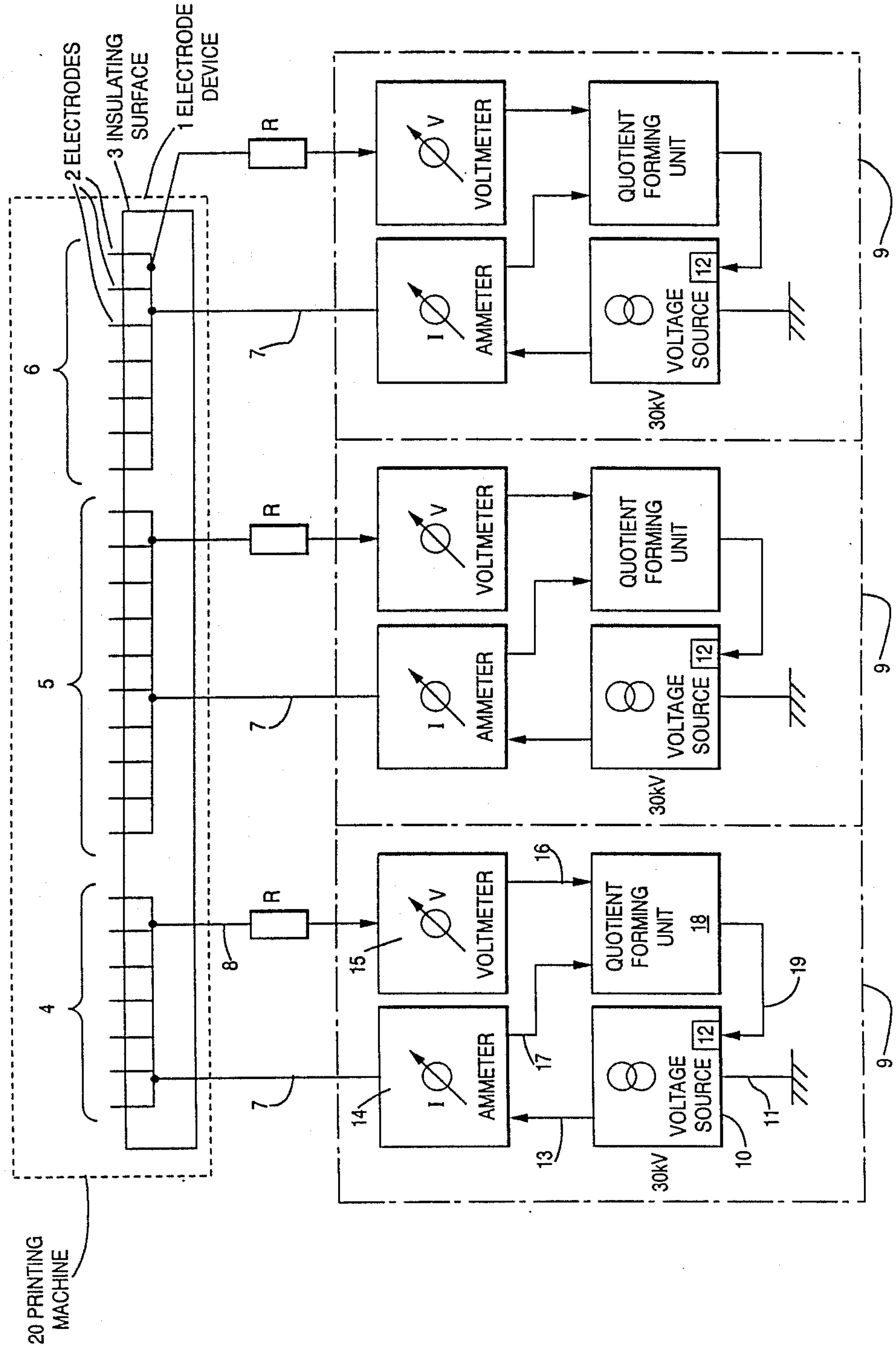
2 ELECTRODES
3 INSULATING SURFACE
1 ELECTRODE DEVICE
20 PRINTING MACHINE
R
VOLTMETER
AMMETER
QUOTIENT FORMING UNIT
QUOTIENT FORMING UNIT 18
VOLTAGE SOURCE
12
30kV
V
I
4
5
6
7
8
9
10
11
13
14
15
16
17
19

HIGH VOLTAGE ELECTRODE DEVICE

The present invention relates to a high voltage electrode device wherein individual electrodes arranged to be energized and deenergized in groups or individually and which project beyond an insulating surface, are utilized to set an effective operating width of a machine. Such high voltage electrode devices having individual electrodes which can be energized are known in the art as, for example, DOS 2,948,902. Switching is effected in such a device by way of a hydraulic or pneumatic medium supplied separately to the individual electrodes via a pressure-tight conduit.

Apart from problems encountered due to the need for space for the switching conduits for the hydraulic or pneumatic medium, the switchable individual electrodes occupy a large amount of space so that, in total, a high voltage electrode device having a large structural size is obtained. Furthermore, problems of sparking during the switching operation cannot be tolerated when such a high voltage electrode device is utilized in explosion proof areas, apart from the fact that, when the individual electrodes are deenergized, discharge paths, leakage currents, etc., result.

It is an object of the present invention to provide a high voltage electrode device formed of individual electrodes which has a compact size so that the high voltage electrode device can be switched without sparking and, thereafter, leakage currents can be reliably prevented.

In accordance with the present invention, the high voltage electrode device having individual electrodes, preferably point electrodes, which can be energized and deenergized in groups or individually and which project beyond an insulating surface, for use in a machine such as a printing machine in order to set the effective operating width thereof, is arranged such that the individual electrodes of each group are connected to the same high voltage source with the high voltage source being arranged for being turned off by way of a control input, each group of individual electrodes being connected to a voltmeter, and each high voltage source being associated with an ammeter, the ammeter and the voltmeter being connected to a quotient-forming unit for transmitting an output signal when a quotient thereof exceeds or, respectively, falls below a specific reference value, and the output of the quotient-forming unit is connected to the control input of the high voltage source.

These and further objects, features and advantages of the present invention will become more obvious from the following description when taken in connection with the accompanying single FIGURE of drawing which shows, for purposes of illustration only, a single embodiment in accordance with the present invention and wherein:

The single FIGURE illustrates a schematic view of the high voltage electrode device with associated circuits.

Referring now to the single figure of the drawing, there is illustrated a high voltage electrode device 1 formed of individual electrodes 2 projecting beyond an insulating surface 3 and being preferably point electrodes. As illustrated, the individual electrodes are connected into three groups 4, 5 and 6 of individual electrodes, lying side-by-side, so that there results different effective operating widths for the high voltage electrode device 1. That is, there is an effective operating width provided by the width of group 5 by itself, the effective operating width of group 4 plus group 5′, or group 5 plus group 6′, or the effective operating width of groups 4, 5 and 6, for example.

Each group of electrodes 4, 5 and 6 is connected to a high voltage lead wire 7 as well as a voltmeter line 8 with a resistor R. Both lines 7, 8 are connected to a circuit 9 including circuit elements. The circuit in detail will be described only for the group 4 of individual electrodes, since it is the same for all electrode groups.

The circuit 9 includes a high voltage source 10 which is grounded by way of a line 11 and providing, for example, 30 kV. The high voltage source includes a control input 12, by means of which, the high voltage source can be turned off. An output line 13 of the high voltage source 10 is connected to an ammeter 14 which in turn is connected to the high voltage feed line 7 which is connected to the group of individual electrodes 2. A voltmeter 15 is connected to the voltmeter line 8 and an output 16 of the voltmeter is connected to a quotient forming unit 18 also receiving an output 17 from the ammeter 14. The quotient-forming unit 18 transmits a signal via an output line 19 to the control input 12 of the high voltage source 10 when, for example, the measured quotient value falls below a reference value, and upon occurrence of this signal, the high voltage source 10 is turned off.

As is apparent, the voltage is measured by way of the voltmeter 15 connected in the voltmeter line 8 and the current flowing in the high voltage source 10 and in the high voltage feed line 7 is measured by the ammeter 14 with the measured outputs being supplied to the quotient-forming unit 18 via output lines 16 and 17, respectively. In this manner, it can be determined by the quotient-forming unit whether the high-voltage electrode device charges, as desired, for example, a travelling web of material, e.g., of paper, when the high voltage electrode device is utilized in a printing machine 20, or whether there is no web of material present in opposition to the electrode. However, prior to effecting such measurement, a first measurement is carried out without a paper web in order to set a reference value in a storage device of the quotient-forming unit 18. In this manner, it can be automatically determined that there is no web of material present in the printing machine 20 and opposing the electrodes so that when there is no web of material present opposing a group of electrodes, a respective group of electrodes can be turned off. Also, with an appropriate choice of the reference value, it is possible to detect aging and contamination of a respective group of electrodes or of an individual electrode. Further, there is no need for mechanical switching in the zone of the high voltage electrode device, with the attendant known disadvantages thereof. However, it is, of course, likewise possible, after examining the voltage and measuring the current, to cut out a group of electrodes not only automatically, but also manually.

Although the single FIGURE illustrates only simple individual electrodes having taps arranged in groups for a voltmeter line, optionally by way of resistors, which are negligible from the viewpoint of structural size, if required, such can be cast in place together with the individual electrodes.

While I have shown and described only one embodiment in accordance with the present invention, it is understood that the same is not limited thereto but is susceptible of numerous changes and modifications as known to those skilled in the art and I therefore do not wish to be limited to the details shown and described herein but intend to cover all such changes and modifications as are encompassed by the scope of the appended claims.

What is claimed:

1. A high voltage electrode device comprising a plurality of individual electrodes having end portions projecting beyond an insulating surface and arranged to form at least one group of electrically connected electrodes, means for energizing and deenergizing the at least one group of electrodes, the energizing and deenergizing means including high voltage source means having control means for turning off the high voltage source means, the high voltage source means providing an output to the at least one group of electrodes via current measuring means, the current measuring means providing an output indicative of the current measured, voltage measuring means connected to the at least one group of electrodes and providing an output indicative of the voltage measured, and quotient forming means responsive to the outputs of the current measuring means and the voltage measuring means for forming a quotient thereof and providing an output when the quotient formed has a predetermined relation to a reference value, the control means being responsive to the output of the quotient forming means for turning off the high voltage source means.

2. A high voltage electrode device according to claim 1, further comprising resistance means connecting the voltage measuring means and the at least one group of electrodes.

3. A high voltage electrode device according to claim 2, wherein the resistance means is an ohmic resistor.

4. A high voltage electrode device according to claim 1, wherein the plurality of individual electrodes extend side-by-side along the insulating surface and form a plurality of groups of electrically connected electrodes, and further comprising a plurality of energizing and deenergizing means, a respective energizing and deenergizing means being associated with a respective group of electrodes.

5. A high voltage electrode device according to claim 4, further comprising resistance means connecting the voltage measuring means of a respective energizing and deenergizing means and the associated group of electrodes.

6. A high voltage electrode device according to claim 5, wherein the resistance means is an ohmic resistor.

7. A high voltage electrode device according to claim 4, wherein the groups of electrodes form a part of a printing machine and are energized and deenergized for setting the effective operating width thereof.

8. A high voltage electrode device according to claim 4, wherein the plurality of individual electrodes are point electrodes.

9. A high voltage electrode device according to claim 4, wherein the quotient forming means provides an output signal when the quotient formed is one of above and below the reference value.

* * * * *